(12) United States Patent
Zhang (10) Patent No.: US 8,319,959 B2
(45) Date of Patent: Nov. 27, 2012

(54) SYSTEM AND METHOD FOR QUALITY ASSURANCE FOR RETICLES USED IN MANUFACTURING OF INTEGRATED CIRCUITS

(75) Inventor: Leon Zhang, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 228 days.

(21) Appl. No.: 12/724,276

(22) Filed: Mar. 15, 2010

(65) Prior Publication Data

US 2010/0233594 A1  Sep. 16, 2010

(30) Foreign Application Priority Data

Mar. 13, 2009  (CN) .......................... 2009 1 0047631

(51) Int. Cl.
*G01N 21/00* (2006.01)
(52) U.S. Cl. .................................. 356/237.2; 356/237.1
(58) Field of Classification Search .... 356/237.1–237.6; 430/30, 5, 269; 382/144; 378/34–35, 70; 250/559.4, 559.45, 559.39, 559.46, 492.1–492.2
See application file for complete search history.

(56) References Cited

U.S. PATENT DOCUMENTS

| | | | |
|---|---|---|---|
| 6,627,362 B2 | 9/2003 | Stivers et al. | |
| 7,599,053 B2 * | 10/2009 | Yamaguchi | 356/237.4 |
| 2005/0226492 A1 | 10/2005 | Ho | |
| 2007/0188743 A1 | 8/2007 | Tanaka | |
| 2007/0229814 A1 * | 10/2007 | Yamaguchi | 356/237.4 |
| 2008/0192238 A1 | 8/2008 | Kusunose et al. | |
| 2009/0042109 A1 * | 2/2009 | Okubo | 430/5 |

FOREIGN PATENT DOCUMENTS

| | | |
|---|---|---|
| JP | 2001153637 A | 8/2001 |
| JP | 2007-518257 A | 7/2007 |

* cited by examiner

*Primary Examiner* — Tri T Ton
(74) *Attorney, Agent, or Firm* — Kilpatrick Townsend & Stockton LLP (57) ABSTRACT

System and method for quality assurance for reticles used in manufacturing of integrated circuits. According to an embodiment, the present invention provides a method for inspecting one or more blanks. For example, the blanks are prepared to be used as reticles for manufacturing of integrated circuits. The method includes a step for providing a blank. For example, the blank includes an unknown level of impure particles. The method also includes a step for subjecting the blank to radiation at a first radiation level. The method additionally includes a step for receiving reflected radiation by the radiation source. Also, the method includes a step for determining a particle level based on at least the reflected radiation. Additionally, the method includes a step for determining whether to use the blank to produce a reticle.

14 Claims, 10 Drawing Sheets

FIG. 10

SYSTEM AND METHOD FOR QUALITY ASSURANCE FOR RETICLES USED IN MANUFACTURING OF INTEGRATED CIRCUITS

CROSS-REFERENCES TO RELATED APPLICATIONS

This application claims priority to Chinese Patent Application No. 200910047631.8 (SMIC Docket No. 2005-00334-SH-US) filed on Mar. 13, 2009, commonly assigned and hereby incorporated by reference for all purpose herein.

BACKGROUND OF THE INVENTION

The present invention is directed to integrated circuits and their processing for the manufacture of semiconductor devices. More particularly, the invention provides a method and system for quality assurance of reticle fabrication for the manufacture of integrated circuits. Merely by way of example, the invention has been applied to a reticle blank. But it would be recognized that the invention has a much broader range of applicability.

Integrated circuits or "ICs" have evolved from a handful of interconnected devices fabricated on a single chip of silicon to millions of devices. Current ICs provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of ICs. Semiconductor devices are now being fabricated with features less than a quarter of a micron across.

Increasing circuit density has not only improved the complexity and performance of ICs but has also provided lower cost parts to the consumer. An IC fabrication facility can cost hundreds of millions, or even billions, of dollars. Each fabrication facility will have a certain throughput of wafers, and each wafer will have a certain number of ICs on it. Therefore, by making the individual devices of an IC smaller, more devices may be fabricated on each wafer, thus increasing the output of the fabrication facility. Making devices smaller is very challenging, as each process used in IC fabrication has a limit. That is to say, a given process typically only works down to a certain feature size, and then either the process or the device layout needs to be changed. An example of such a limit is chemical dry etching process used for the manufacture of integrated circuits in a cost effective and efficient way.

The manufacturing of integrated circuits involves various processes. For example, the processes include, inter alia, wafer growth, photolithography, doping, oxidation, deposition, etching removal, and epitaxial growth.

Semiconductor devices and circuits are formed in wafers, which serve as substrates. Generally, single-crystal substrates, which are made from a single material with crystals formed by atoms all aligned in a specific direction. The process of waver creation usually involves creating a large ingot of semiconductor materials, aligning the ingot, removing impurities, slicing ingot into thin wafers, and polishing the sliced wafers.

Generally, photolithography process is used to define and shape specific areas of the wafer to suit particular design of integrated circuit. Usually, a layout design is used to create an optical mask (or reticle pattern, depending on application). The wafer surface is usually covered with a layer of photoresist. The wafer is then exposed to light through the optical mask. After light exposure, the areas of photoresist that were exposed to light are removed using chemical process. As a result, the wafer contains both clear areas (where photoresist is removed) and areas blocked by photoresist. Next, various processes (such as etching, oxidation, diffusion, etc.) only affecting clear areas are performed. After various processes are finished, photoresist materials are then removed.

Photolithography process is crucial to the process of semiconductor fabrication. For example, inaccurate reticle patterns lead to low quality and/or unusable end products. Over the past, various conventional techniques have been developed to ensure the accuracy of photolithography processes. Unfortunately, these techniques have been inadequate.

Therefore, it is desired to have an improved system and method for ensuring the quality of reticles used for the manufacturing of integrated circuits.

BRIEF SUMMARY OF THE INVENTION

The present invention is directed to integrated circuits and their processing for the manufacture of semiconductor devices. More particularly, the invention provides a method and system for quality assurance of reticle fabrication for the manufacture of integrated circuits. Merely by way of example, the invention has been applied to a reticle blank. But it would be recognized that the invention has a much broader range of applicability.

According to an embodiment, the present invention provides a method for inspecting one or more reticle blanks. For example, the one or more reticle blanks are prepared to be used as reticles for manufacturing of integrated circuits. The method includes a step for providing a blank. For example, the blank includes an unknown level of impure particles. The method also includes a step for subjecting the blank to radiation at a first radiation level. For example, the radiation is emitted from a radiation source, which is capable of emitting radiation in accordance to one or more reticle patterns. The method additionally includes a step for receiving reflected radiation by the radiation source. Also, the method includes a step for determining a particle level based on at least the reflected radiation. Additionally, the method includes a step for determining whether to use the blank to produce a reticle. Furthermore, the method includes a step for forming at least a reticle pattern on the blank using the radiation source if the particle level is below a threshold level. For example, the radiation source emits radiation at a second radiation level.

According to another embodiment, the present invention provides a method for preparing one or more reticles for manufacturing of integrated circuits. The method includes a step for providing a blank. For example, the blank includes an unknown level of impure particles. The method also includes a step for obtaining one or more reticle patterns. The method includes a step for subjecting the blank to laser light. For example, the laser light is emitted from a reticle writer. The reticle writer is configured to emit laser light in accordance to the one or more reticle patterns. The method additionally includes a step for determining a particle level based on reflected laser light from the blank. Also, the method includes a step for determining whether to use the blank to produce a reticle. Furthermore, the method includes a step for forming at least a reticle pattern on the blank using the reticle writer and inspecting the reticle pattern if the particle level is below a threshold level.

According to yet another embodiment, the present invention provides a system for inspecting one or more blanks. For example, the blanks are prepared to be used as reticles for manufacturing of integrated circuits. The system includes a radiation source configured to emit radiation for forming one or more reticle patterns on the one or more blanks. For example, the radiation source is capable of receiving reflected radiation. The system also includes a radiation sensing component that is configured to monitor reflected radiation received by the radiation source. The radiation sensing component determines a particle level based on reflected radiation. The radiation sensing component determines whether to use the blank to produce a reticle based on the particle level.

According to yet another embodiment, the present invention provides a system for inspecting one or more blanks. For example, the one or more blanks being prepared to be used as reticles for manufacturing of integrated circuits. As an example, each of the one or more blanks can be characterized by an unknown level of impure particles. The system includes a radiation source that is configured to emit radiation onto the one or more blanks for forming one or more reticle patterns on the one or more blanks. The system also includes a radiation sensing component that is configured to monitor reflected radiation from the one or more blanks. The radiation sensing component determines a particle level based on reflected radiation. The radiation sensing component determines whether to use the blank to produce a reticle based on the particle level.

Many benefits are achieved by way of the present invention over conventional techniques. For example, the present technique provides an easy to use process that relies upon conventional technology. In some embodiments, the method provides an improved system and method for ensuring the quality of reticles used for the manufacturing of integrated circuits. For example, potential and real defects associated with reticles are detected at an early stage of the lithography process. Additionally, the method provides a process that is compatible with conventional process technology without substantial modifications to conventional equipment and processes. For example, an embodiment of the present invention utilizes conventional lithography tools with slight modifications to be used for blank detect detection. In addition, certain embodiments of the present invention offer a low-cost solution for blank inspection. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

DETAILED DESCRIPTION OF THE INVENTION

The present invention is directed to integrated circuits and their processing for the manufacture of semiconductor devices. More particularly, the invention provides a method and device for an etching process for the manufacture of integrated circuits. Merely by way of example, the invention has been applied to patterning of a device structure for the etching process for the manufacture of integrated circuits. But it would be recognized that the invention has a much broader range of applicability.

Lithography is an integral and crucial aspect of semiconductor manufacturing. Reticles are used for forming patterns on substrates for various layers of device structures. Poor quality reticles often lead to defective devices and low yield.

Figure 1:
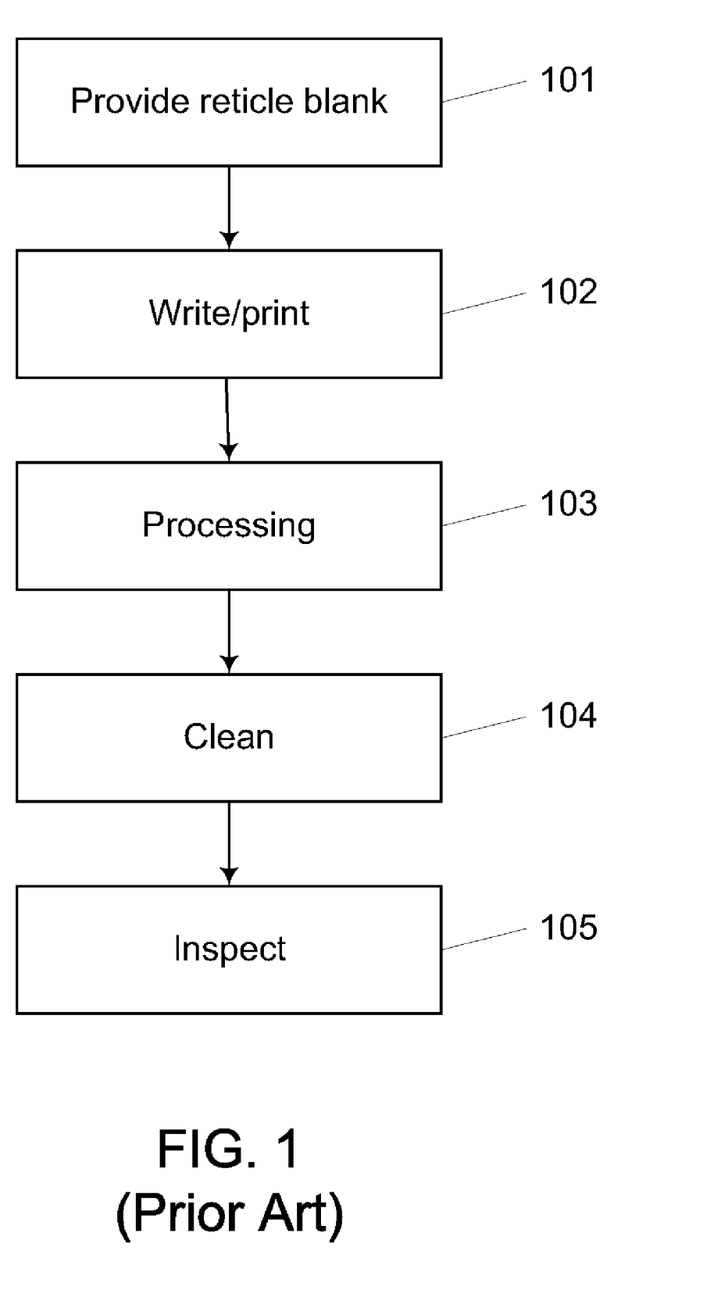
FIG. 1 is a simplified diagram of a convention method for reticle quality assurance.

Various methods have been developed to ensure reticle quality. FIG. 1 is a simplified diagram of a convention method for reticle quality assurance. This diagram is merely an example, which should not unduly limit the scope of the claims. One of ordinary skill in the art would recognize many variations, alternatives, and modifications.

At step 101, a reticle blank is provided, the reticle blank can be a quartz substrate having a chrome material formed thereon.

At step 102, expose the blank, for example, to an electron beam to etch the chrome layer and form a reticle pattern.

At step 103, further process the reticle.

At step 104, the reticles are cleaned so they can be used for patterning of a device.

At step 105, inspections are performed on the reticles to ensure that reticles satisfy a quality standard. For example, the inspection determine if the defect level is within a certain control limit to ensure that the substrate pattern would not be affected.

The above method only determine reticles quality after patterns have been transferred to reticles. This method is often inefficient. For example, one of the major causes for defective reticles is the quality and defect level of blanks leading to poor quality reticles. Defects inherited from blanks are not detected until various processes have been performed and valuable resources have been wasted.

To address the problem described above, various conventional techniques have been developed. For example, blanks are inspected for defects and contaminants by various photomask makers before the blanks are used in lithography. Unfortunately, blank inspection has a prohibitive high cost. For example, a blank inspection machine is usually expensive, costing up to millions of dollars and further increase the cost of manufacturing. In other instances, extra steps of blank inspection can incur contaminants on the blank.

Therefore, embodiments of the present invention provide an effective and cost effective method for blank inspection.

Embodiments according to the present invention provides a system and a method for inspecting a reticle blank. The present system and method uses a modification to an existing reticle writing system to inspect the reticle blank before or during the exposing step. A costly standalone and dedicated blank inspection system is eliminated.

Figure 2:
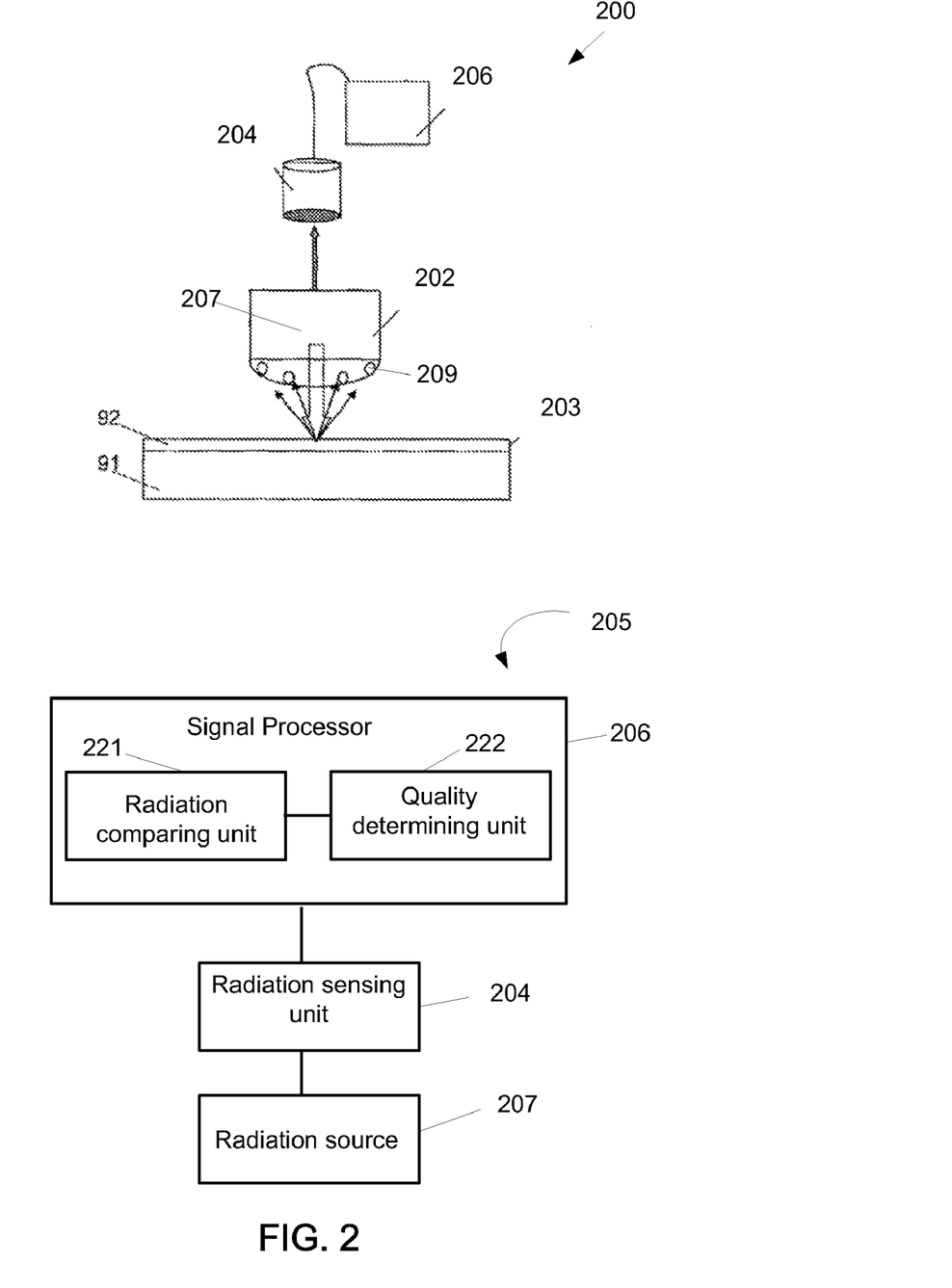
FIG. 2 is a simplified diagram illustrating a blank inspection system according to an embodiment of the present invention.

FIG. 2 is a simplified diagram illustrating a reticle blank inspection system according to an embodiment of the present invention. This diagram is merely an example, which should not unduly limit the scope of the claims. One of ordinary skill in the art would recognize many variations, alternatives, and modifications.

As shown in FIG. 2, a blank inspection system 200 may include the following components:
1. a reticle writer 202, the reticle writer comprises a radiation emitter 207 and one or more radiation receivers 209;
2. a radiation sensing unit 204; and
3. a signal processor 206.

A corresponding schematic outline 205 of the various components for the blank inspection system is also shown.

As shown in FIG. 2, the reticle writer emits radiation from radiation emitter 207 onto a reticle blank 203. The emitted radiation can be for pattern writing in a specific embodiment. The reticle blank 203 may comprise a substrate 91 having an overlying chrome material 92. The substrate is usually made of a quartz material but can also be others. Depending upon the application, radiation types such as x-ray, ion beam, electron beam, EUV laser, or others, may be emitted by the reticle writer. In certain embodiments, a photoresist layer is first deposited overlying the chrome material. The photoresist layer is then patterned according to a device design and be exposed to the emitted radiation in the reticle writer. In a specific embodiment, the reticle writer maybe configured to emit low energy laser light solely for the purpose of blank inspection. As shown, the reticle writer 202 includes radiation receivers 209. As an example, many conventional reticle writers include radiation receivers that are used for calibration or focusing purposes. It is appreciated that certain embodiments of the present invention is compatible with convention reticle writers. In a specific embodiment, radiation sensing unit 204 receives the radiation scattered and reflected from the reticle blank surface and the scattered and reflected radiation is analyzed by signal processor 206. Radiation sensing unit can be a light receiving head or a light transceiver/sensor combination depending on the application.

As shown in simplified schematic 205, the blank inspection system includes a signal processing unit 206 to process the radiation received in the radiation sensing component. In a specific embodiment, the signal processing unit can include a radiation comparing unit 221 to compare the light received from the light sensing component to a reference and a quality level of the reticle blank is determined by a quality determining unit 222. The reference can be obtained from a reticle blank, which has a predetermined acceptable quality or defects levels that would affect the quality of a reticle after writing. In a specific embodiment, the quality of reticle blank 203 is determined by a level of impure particles or other contaminants and other defects such as scratches on the blank. For a reticle blank having an unknown defect level or quality level before or after pattern writing, the reflected and scattered radiation would have a different intensity and intensity distribution when compare to the reference. In a specific embodiment, the quality determination unit can also determine the quality of a reticle corresponding to a radiation intensity distribution to quantify a quality of a surface of the reticle, for example, particles per unit area.

Accordingly, the present invention uses the radiation emitter in a conventional reticle writer to provide a radiation source for inspecting a reticle blank. As described previously, the reflected radiation from the surface is transmitted to a radiation sensor unit and the quality of the reticle blank can be determined by a signal processing unit during writing of the reticle. Additionally, the inspection may also be performed before writing to determine defects and particles on the surface of the blank. In a specific embodiment, the reticle blank inspection system determines the quality of a reticle blank before or during writing. If the reticle blank is determined to have too many defect and not suitable for fabricating a reticle, the reticle blank can be subjected to a re-work (for example, cleaning) or if the defect level is such that the reticle blank is beyond repair, the reticle blank can be scraped. This avoids subsequent costly processes to be performed on an otherwise rejected blank. Moreover, the present reticle blank inspection system merely uses certain add-on parts on an existing reticle writer without having to use an expensive standalone system. Additionally, the present reticle inspection method can be performed during reticle writing without incurring extra process steps, saving valuable resources while improving yield.

Figure 3:
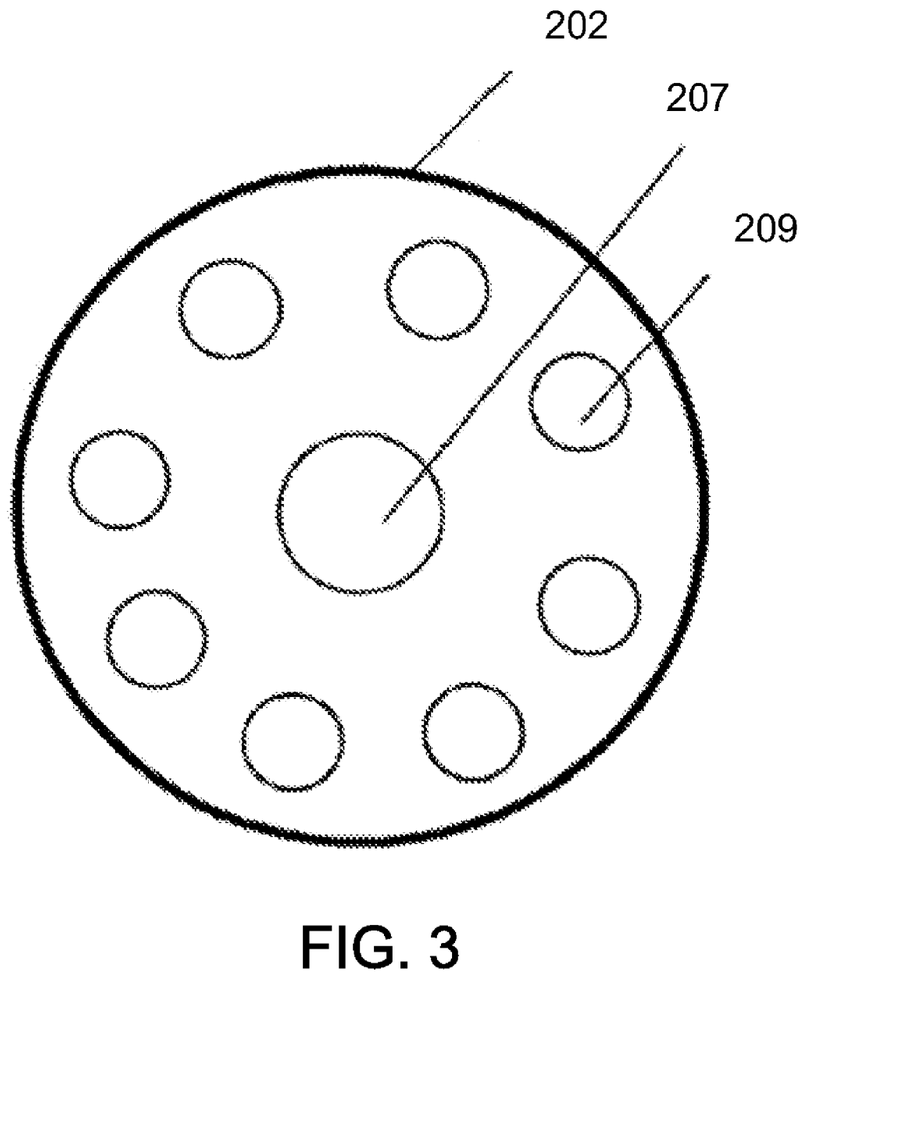
FIG. 3 is a simplified diagram illustrating a bottom view of a blank inspection system according to an alternative embodiment of the present invention.

FIG. 3 illustrates a bottom view of reticle writer 202 in FIG. 2. Reticle writer 202 includes radiation emitter 207 and the at least two radiation receivers 209. Depending on the application, radiation can include laser, x-rays, ion beams, electron beams, EUV light, and others. The radiation emitter and the at least two radiation receivers are components and fixed parts of the reticle writer. In the process of pattern writing, the radiation emitter emits radiation and focuses radiation on the reticle blank, which can have a photoresist layer deposited thereon to write patterns on the reticle blank. A conventional reticle writer usually includes radiation receivers for calibration and adjustment of radiation intensity. In additional to calibration and adjustment, the radiation receiver can use the reflected radiation received in the radiation sensing unit to inspect the reticle blank concurrently. In a specific embodiment, the reticle writer is configured to emit radiation at different radiation levels (for example, high radiation level for reticle patterning and low radiation level for inspecting blanks). Radiation receivers 209 are configured to receive radiation reflected from the blank. In a specific embodiment, the reticle writer includes radiation transmitters, which can be an optical lens system operably coupled to the radiation emitter and/or radiation receiver in a specific embodiment. The one or more radiation transmitters can function as the radiation receivers for the reticle writer and receive reflected light from a reticle blank to adjust the radiation level. In this embodiment, the one or more radiation transmitters are used to receive the reflected or scattered light from the reticle blank and transmit the reflected light into radiation sensor unit 204 to provide for reticle blank inspection during reticle writing. For a reticle writer using an electron beam, the reticle writer uses an electro-magnetic focusing system coupled with the electron source. In this instance, the one or more radiation emitters provides an objective for the electro-magnetic focusing system. The electro-magnetic focusing system can include one or more electro-magnetic lenses. The one or more radiation transmitters function as electron beam receiver. Additionally, the one or more radiation transmitters receives radiation reflected from the reticle blank and transmit the reflected radiation to the radiation sensing unit to inspect the reticle blank. According to certain embodiments, the radiation receivers determine the radiation level for the received radiation.

Preferably, one or more additional light receivers may be provided in the reticle writer as added components for the reticle writer. For example, one or more additional radiation receivers can be installed in vicinities of each of radiation receivers 209 in FIG. 3. That is, the reticle writer can further includes added parts in additional to fixed parts to provide accurate and reliable inspection results in a specific embodiment.

Figure 4:
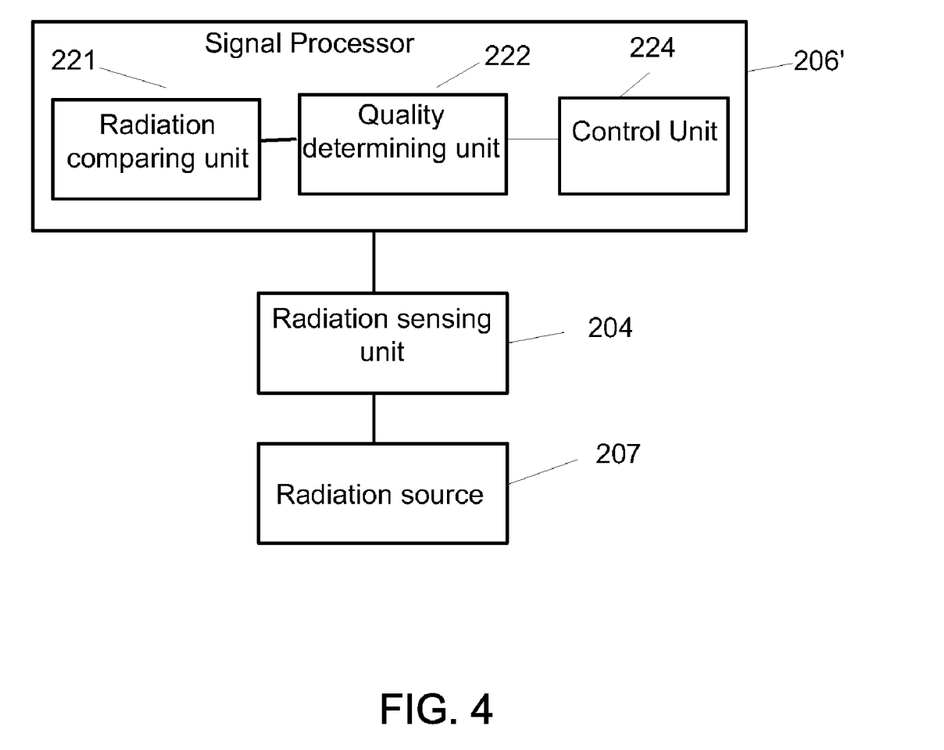
FIG. 4 is a simplified block diagram illustrating a blank inspection system according to an embodiment of the present invention.

Depending on the embodiment, there can be other variations. As shown in FIG. 4, the signal processor 206' can further include a control unit 224. In a specific embodiment, the control unit is connected to an export terminal of the quality determining unit. The control unit uses the quality state determined by the quality determining unit to determine if the defect level is within a threshold value. If the defect level on the reticle blank is within the threshold value, a pattern is written on the reticle blank, which forms a reticle for integrated circuit patterning. If the defect level determined by the quality determining unit is higher than the threshold value, the reticle blank is subjected to re-work until the defect level is within the threshold value. The reticle blank may be scrapped if it is determined that the defect level cannot be improved.

Figure 5:
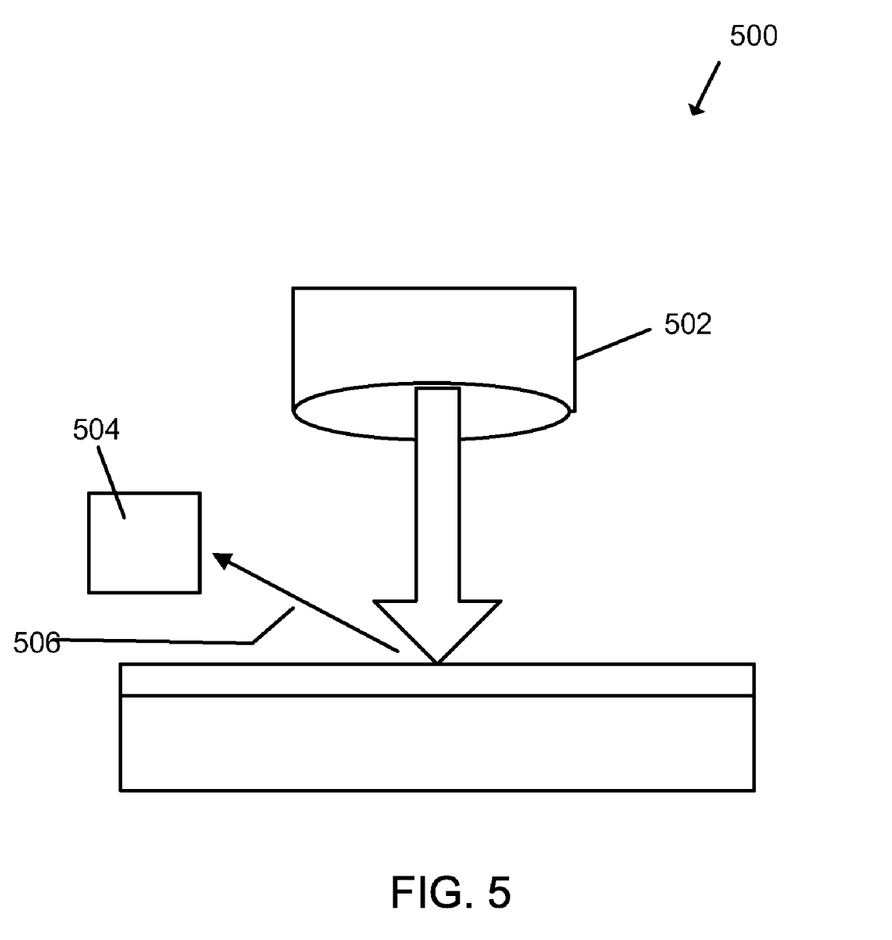
FIG. 5 is a simplified diagram of a reticle writer according to an embodiment of the present invention.

FIG. 5 is a simplified diagram illustrating a reticle blank inspection system 500 according to an alternative embodiment of the present invention. As shown in FIG. 5, reticle blank inspection system 500 includes a reticle writer 502 and a light sensing unit 504. According to a specific embodiment, reticle writer 502 is configured to emit a laser light onto a reticle blank 503. For example, the reticle blank includes a quartz substrate 510 with an overlying chrome material 512 and a photoresist layer deposited on a surface region of the chrome material. Depending upon the application, radiation types such as x-ray, ion beam, EUV, or laser may be emitted by the reticle writer. In a specific embodiment, the reticle writer is configured to emit low energy laser light solely for the purpose of reticle blank inspection. The light sensing component is positioned in a vicinity of the blank at an oblique angle to the blank to receive scattered or reflected light 506 from defects on the blank in a specific embodiment. The light sensing component receives the reflected light and the scattered light and determines a defect level and the quality of the reticle blank according to a specific embodiment. The quality of blank is determined by the level of impure particles or contaminants or defects such as scratches on the reticle blank.

Figure 6:
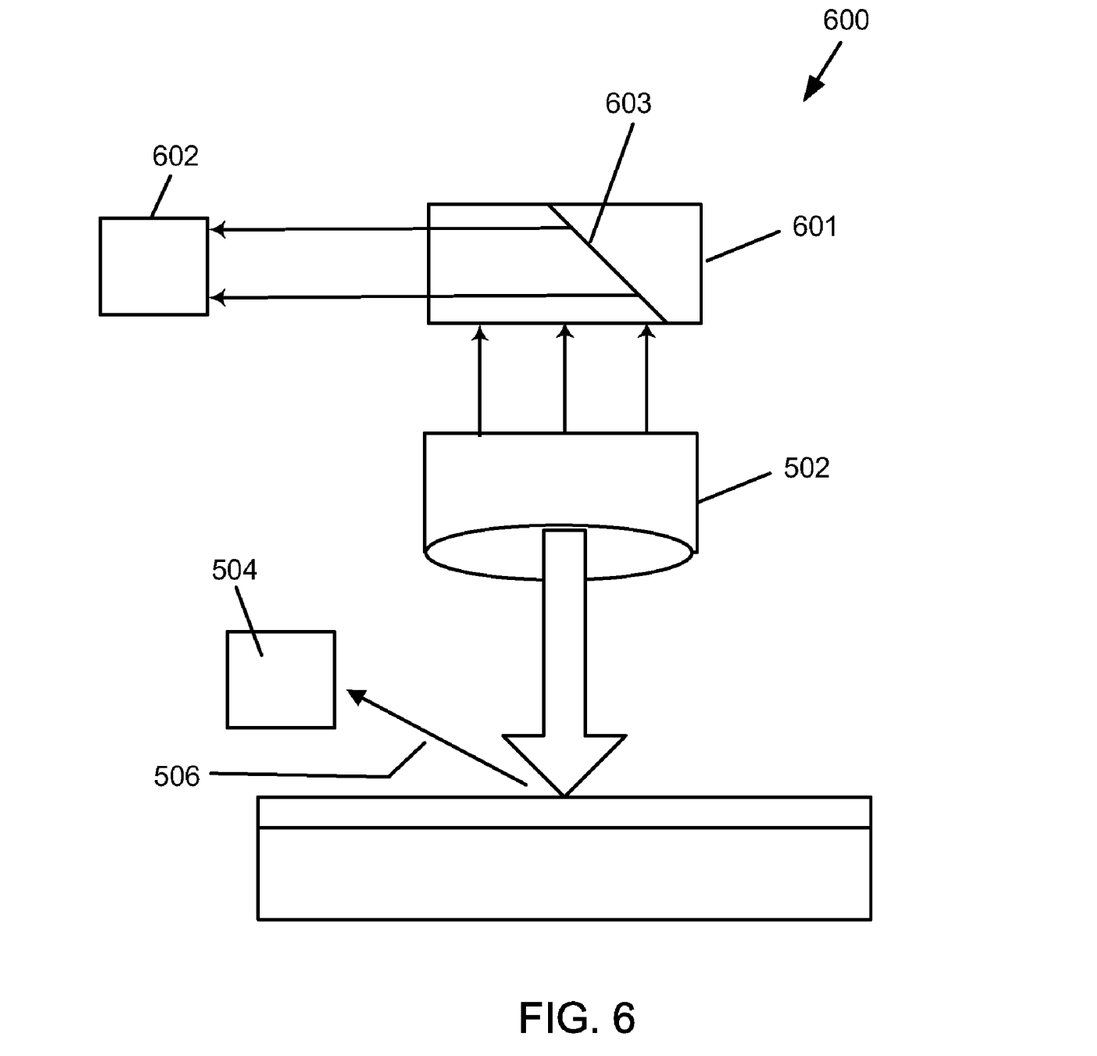
FIG. 6 is a simplified diagram of a reticle writer according to an embodiment of the present invention

FIG. 6 is a simplified diagram illustrating a blank inspection system 600 according to an yet alternative embodiment of the present invention. This diagram is merely an example, which should not unduly limit the scope of the claims. One of ordinary skill in the art would recognize many variations, alternatives, and modifications.

As shown in FIG. 6, blank inspection system 600 can further include a second radiation transmitter 601 and a second radiation sensing unit 602 in addition to the various parts of the blank inspection system illustrated in FIG. 4. Like references are used in FIG. 6 as in other figures. The second radiation transmitter and the second radiation sensing unit are provided to capture scattered and reflected radiation from the reticle blank surface that is not captured by radiation sensing unit 404 in FIG. 4 and enhance the sensitivity of the blank inspection system. As shown, the second radiation transmitter comprises one or more optical lenses, prisms, or mirrors 603 to redirect the scattered and reflected radiation into the second radiation sensing unit in a specific embodiment. The reticle blank inspection system further includes a signal processor (not shown) to determine a defect level or a quality level of the reticle blank using at least the scattered and reflected radiation in a specific embodiment.

Figure 7:
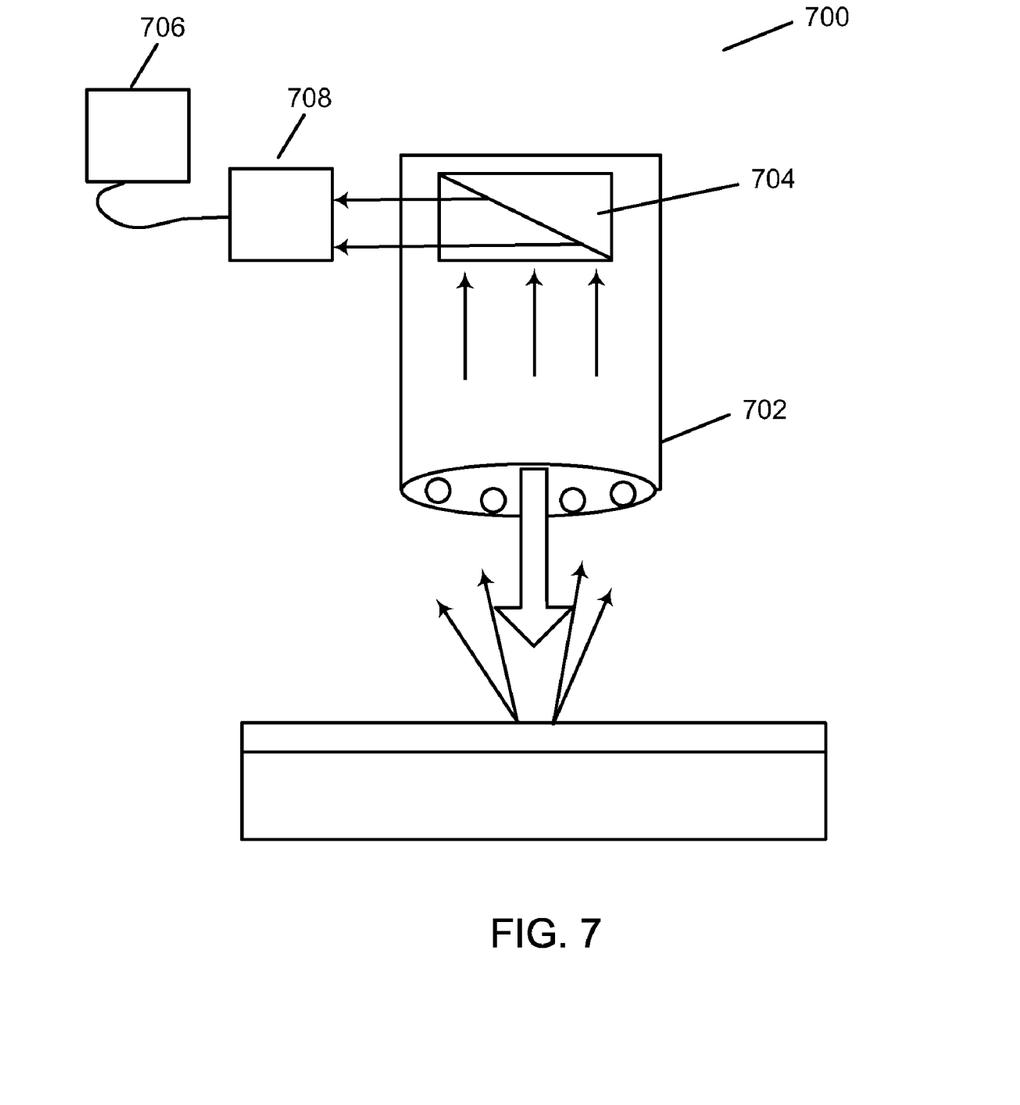
FIG. 7 is a simplified diagram of a reticle writer according to an embodiment of the present invention.

Depending on the embodiment, there can be other alternatives as shown in the simplified diagram in FIG. 7. As shown, a reticle blank inspection system 700 includes a radiation emitter and transmitter 702. In this embodiment, radiation sensing unit 708 is positioned at a distance from the radiation emitter and cannot receive reflected and scattered radiation as in FIG. 2. A radiation transmitting unit 704 is configured to direct reflected and scattered radiation from a reticle into radiation sensing unit 708. The radiation transmitting unit can include an optical system such as lenses or mirrors or prisms. In certain embodiment, the optical system can be part of a reticle writer and only a minor adjustment is needed to transmit reflected and scattered radiation into radiation sensing unit 708. Other components such as signal processor 706 can be the same as in other embodiments.

Figure 8:
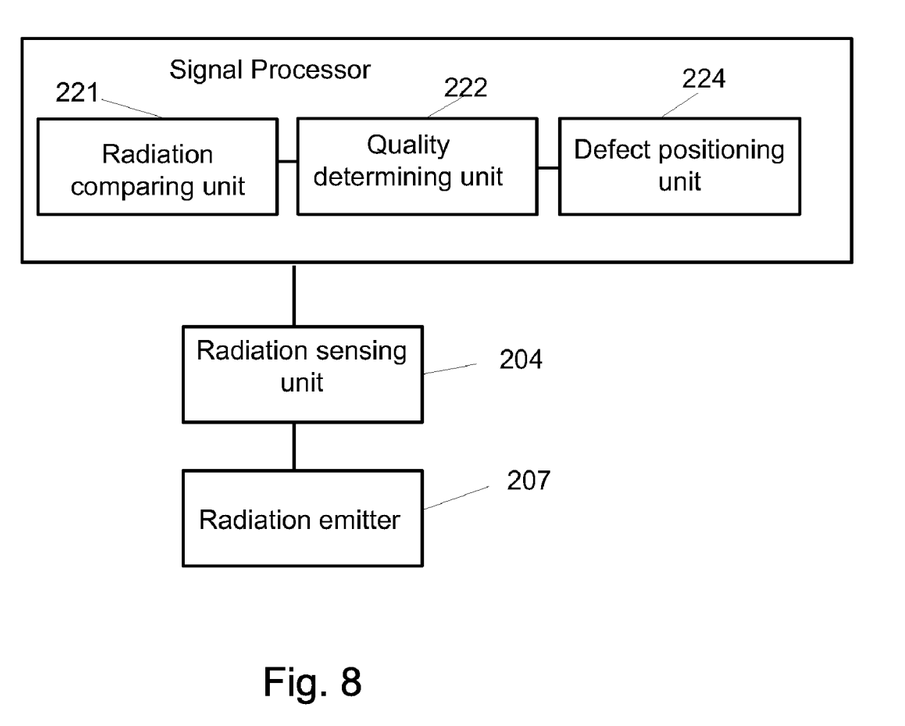
FIG. 8 is a simplified schematic diagram of a reticle writer according to an embodiment of the present invention.

Again, depending on the embodiment, there can be still other variations. As shown in FIG. 8, a schematic for a reticle blank inspection is provided. In a specific embodiment, the signal processing unit can further include a defect positioning unit 224 to locate positions of defects on a reticle blank. Further details are described below and in FIG. 9.

Figure 9:
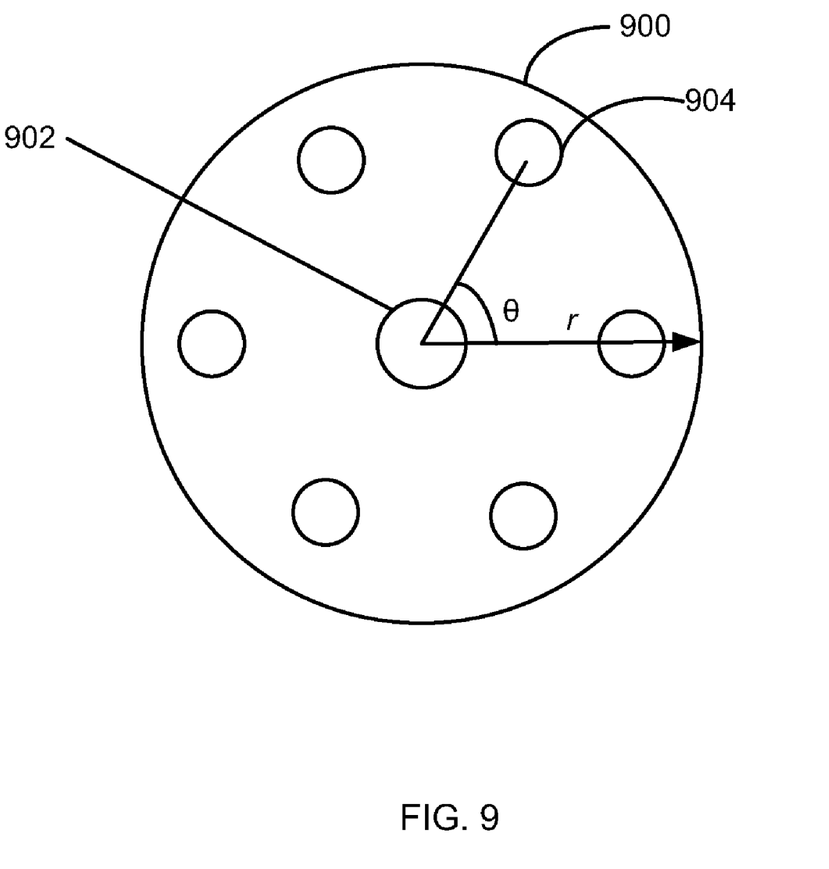
FIG. 9 is a simplified bottom view of a reticle writer according to an embodiment of the present invention

Referring to FIG. 9, a bottom view of a radiation emitter and radiation receiver unit 900 is illustrated. As shown, the radiation emitter and receiver unit includes a radiation emitter 902 and at least two radiation receiving units 904. The at least two radiation receiving units are arranged in a polar coordinate system $(r, \theta)$ in a specific embodiment. In this embodiment, the signal processing unit includes a defect positioning unit or a defect coordinates system to determine locations of the defects on the reticle blank. As shown in FIG. 9, the radiation emitter is located on an origin (0,0) of the polar coordination coordinated system $(r, \theta)$. Six radiation transmission units are illustrated. Each of the radiation transmission unit is located on polar coordinates $(r, 0)$, $(r, \pi/3)$, $(r, 2\pi/3)$, $(r, \pi)$, $(r, 4\pi/3)$, and $(r, 5\pi/3)$, where r is the distance from the radiation emitter to each of the radiation transmission units. In a specific embodiment, the radiation emitter is directed at a center of a reticle blank to be processed and/or inspected. As shown, as position of each of the radiation receiving units is equidistant around the radiation emitter, areas on the reticle blank where radiation is reflected/scattered from can be used to determine a coordinate system for the reticle blank based on the polar coordinates on the radiation emitter/receiver. In a specific embodiment, the intensity distribution of the radiation reflected from a reticle blank is obtained by each of the radiation receiving units. In a preferred embodiment, the radiation intensity distribution obtained by the radiation sensing unit is processed at least by the defect positioning unit within the signal processing unit and the reflected intensity distribution is then used to determine the defect locations on the reticle blank.

From the defect inspection by the defect positioning unit, a quality characteristic as characterized by a defect level of the reticle blank is determined. If the defect level, for example, from contaminant particles, exceeds a threshold value, the reticle blank can be subjected to rework. As the location of the contaminants is determined, the rework can be carried out efficiently. In cases where the defect level is determined to be too high and the reticle blank cannot be reworked, such reticle blank will be scraped without further process into a reticle. This saves resources for processing an otherwise un-usable blank.

According to an embodiment, the present invention provides a method for inspecting one or more blanks. For example, the blanks are provided to be used as reticles for manufacturing of integrated circuits. The method includes a step for providing a reticle blank. For example, the reticle blank includes an unknown level of impure particles. The method also includes a step for subjecting the blank to radiation at a first radiation level. For example, the radiation is emitted from a radiation source, which is capable of emitting radiation in accordance to one or more reticle patterns. The method additionally includes a step for receiving reflected radiation by the radiation source. Also, the method includes a step for determining a particle level based on at least the reflected radiation. Additionally, the method includes a step for determining whether to use the blank to produce a reticle. Furthermore, the method includes a step for forming at least a reticle pattern on the blank using the radiation source if the particle level is below a threshold level. For example, the radiation source emits radiation at a second radiation level.

According to another embodiment, the present invention provides a method for preparing one or more reticles for manufacturing of integrated circuits. The method includes a step for providing a blank. For example, the blank includes an unknown level of impure particles. The method also includes a step for obtaining one or more reticle patterns. The method includes a step for subjecting the blank to laser light. For example, the laser light is emitted from a reticle writer. The reticle writer is configured to emit laser light in accordance to the one or more reticle patterns. The method additionally includes a step for determining a particle level based on reflected laser light from the blank. Also, the method includes a step for determining whether to use the blank to produce a reticle. Furthermore, the method includes a step for forming at least a reticle pattern on the blank using the reticle writer and inspecting the reticle pattern if the particle level is below a threshold level.

In a specific embodiment, the radiation emitter and radiation receiving unit is part of a reticle writer. That is, the system for reticle blank inspection uses a convention reticle writer for reticle patterning. For example, the radiation sensing unit can be a light receiving head or a light sensor. The reticle blank is usually a quartz substrate 91 having a chrome layer 92 overlying the quartz substrate. In certain conventional application, a photoresist is provided overlying a surface region of the chrome layer and a pattern for a integrated circuit design is provided after developing the exposed photoresist. The photoresist is exposed in the reticle writer in a specific embodiment.

Figure 10:
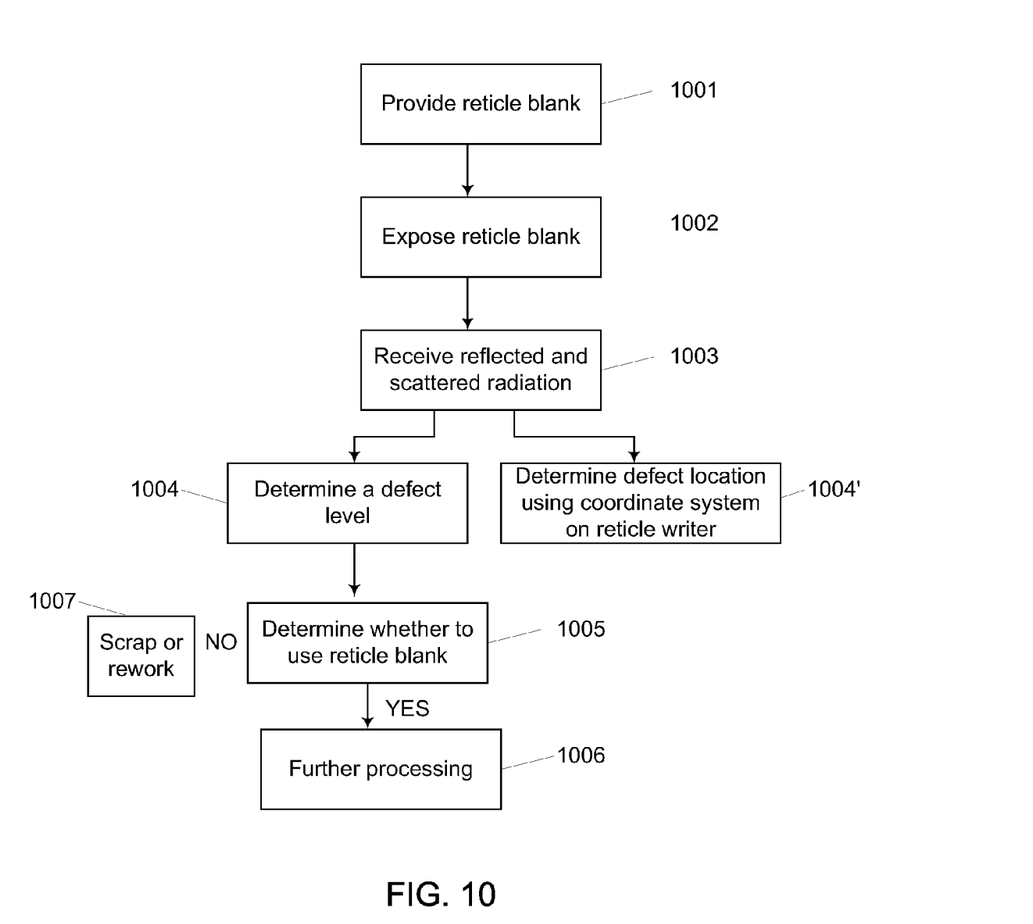
FIG. 10 is a simplified flowchart of a method for blank inspection according to an embodiment of the present invention.

FIG. 10 is a simplified diagram illustrating a method of reticle blank inspection according to an embodiment of the present invention. This diagram is merely an example, which should not unduly limit the scope of the claims. One of ordinary skill in the art would recognize many variations, alternatives, and modifications. For example, various steps may be added, removed, replaced, repeated, overlapped, and/or partially overlapped, which should not unduly limit the scope of claims.

At step 1001, a reticle blank is provided. For example, the reticle blank includes an unknown level of defects including impure particles. For example, a batch of reticle blanks may include a high level of impurities due to contamination or particles or other defects. Depending upon the application, the reticle blank may be selected from a variety of materials. In a specific embodiment, the blank can be made of quartz but can be others.

At step 1002, the blank is subjected to radiation. According to an embodiment, the radiation is laser light. It is to be understood other types of radiations, such as electron beam and x-ray, may be used. For example, the radiation is emitted at a first radiation level (e.g., lower radiation level for the inspection purpose only). According to a specific embodiment, the radiation is emitted from a radiation source. For example, the radiation source is a radiation emitter of a reticle writer. As an example, the radiation source is capable of emitting radiation in accordance to one or more reticle patterns.

At step 1003, the reflected radiation is received. According to an embodiment, the radiation receivers of the reticle writer in FIG. 5 receive the reflected radiation. According to another embodiment, a radiation sensing component receives the reflected radiation. According to yet another embodiment, both radiation receivers of the reticle writer and the radiation sensing component receive the reflected radiation (e.g., as shown in FIG. 6).

At step 1004, the quality of the reticle blank is determined. For example, the quality of the blank is based on a number of particles on at least a surface region of the blank (e.g., the more particles the worse the quality, etc.). As another example, the quality of the reticle blank is based on the uniformity of the blanks. As an example, the radiation sensing component determines the number of particles and/or uniformity of the blank by examining the reflected radiation. For example, the radiation sending component compares the received radiation to a radiation profile. For a reticle blank inspection system having coordinate system attached to the radiation receivers, defect locations on the reticle blank can be determined at step 1004'.

At step 1005, the inspection system determines whether to use the reticle blank to fabricate a reticle based on the result from step 1004 based on the quality of the reticle blank. For example, a logic component of the system compares the number of particles on the blank with a predetermined number of particles.

At step 1006, the blank is processed, if it is determined at step 1006 that the blanks are above a desired quality. For example, if the blank is processed into a reticle, the reticle may be inspected. According to an embodiment, the inspection on the reticle focuses on the fidelity of the reticle (i.e., poor quality only contributed by patterned, not from the quality of the blank). If the defect level is too high, the reticle blank is scraped or sent to rework at step 1007.

Many benefits are achieved by way of the present invention over conventional techniques. For example, the present technique provides an easy to use process that relies upon conventional technology. In some embodiments, the method provides an improved system and method for ensuring the quality of reticles used for the manufacturing of integrated circuits. For example, potential and real defects associated with reticles are detected at an early stage of the lithography process. Additionally, the method provides a process that is compatible with conventional process technology without substantial modifications to conventional equipment and processes. For example, an embodiment of the present invention utilizes conventional lithography tools with slight modifications to be used for detect detection. In addition, certain embodiments of the present invention offer a low-cost solution. Depending upon the embodiment, one or more of these benefits may be achieved.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A system for inspecting an unprocessed reticle blank having an unpatterned opaque material overlying a transparent substrate, the system comprising:
   a radiation emitting component and a radiation receiving component;
   a radiation sensing component; and
   a signal processing component;
   wherein the radiation emitting component and the radiation receiving component are associated with a reticle writing system configured to emit radiation onto a surface of the unpatterned opaque material overlying the transparent substrate of the unprocessed reticle blank and configured to receive a reflected radiation from the surface of the unpatterned opaque material overlying the transparent substrate of the unprocessed reticle blank and delivering the reflected radiation to the radiation sensing component; and wherein the signal processing component is configured to determine a defect characteristic of the unprocessed reticle blank using at least the reflected radiation received by the radiation sensing component.

2. The system of claim 1 wherein the radiation emitting component and the radiation receiving component are parts of the reticle writing system configured to emit radiation to form reticle patterns on the unpatterned opaque material overlying a transparent substrate of the unprocessed reticle blank.

3. The system of claim 1 wherein the signal processing component comprises:
a radiation comparing unit; and
a defect determination unit;
wherein the radiation comparing unit is configured to determine a difference between a radiation level received from the radiation sensing component and a reference, and
the defect determination unit is configured to determine a quality level of the unprocessed reticle blank based on at least the difference.

4. The system of claim 3 wherein the signal processing component further comprising a control unit, the control unit being configured to determine if a defect level of the unprocessed reticle blank is within a threshold value,
if the defect level is within the threshold value, the unprocessed reticle blank is used for fabricating a reticle, and
if the defect level is greater than the threshold value, the unprocessed reticle blank is subjected to rework or the unprocessed reticle blank is scrapped.

5. The system of claim 1 wherein the reticle writing system comprises a radiation emitter and at least two radiation transmitters,
wherein the radiation emitter provides radiation to focus on a surface region of the unpatterned opaque material of the unprocessed reticle blank, the reticle emitter being a part of the reticle writing system, and
wherein each of the at least two radiation transmitters is configured to receive reflected radiation from the surface of the unpatterned opaque material of the unprocessed reticle blank and to send the reflected radiation to the radiation sensing component.

6. The system of claim 5 wherein the radiation emitter and the at least two radiation transmitters are arranged in a coordinate system, wherein the signal processing unit further includes a defect positioning unit, the defect positioning unit being configured to use the coordinate system to determine an intensity distribution of radiation received from the radiation sensing component to determine a defect location on the unprocessed reticle blank.

7. The system of claim 6 wherein the at least two radiation transmitters are fixed parts of the reticle writing system.

8. The system of claim 6 wherein the at least two radiation transmitters include at least one added part for the reticle writing system.

9. The system of claim 5 wherein the radiation sensing component is spatially configured at a distance from the radiation emitting and receiving unit, wherein the radiation emitting and receiving component further comprises a radiation transferring unit and configured to cause the radiation received by the radiation transmitter to travel in a different direction and be transmitted to the radiation sensor unit.

10. The system of claim 1 wherein the emitted radiation is selected from laser, x-ray, ion beam, electron beam, or EUV light.

11. A method for determining quality of an unprocessed reticle blank having a pattern-free opaque layer overlying a relatively transparent substrate, the method comprising:
providing the unprocessed reticle blank having the pattern-free opaque layer overlying the relatively transparent substrate;
subjecting the pattern-free opaque layer of the unprocessed reticle blank to a first radiation, the first radiation being provided by a reticle writing system;
receiving a second radiation using the reticle writing system, the second radiation being a radiation reflected from the pattern-free opaque layer of the unprocessed reticle blank; and
determining a quality characteristic of the unprocessed reticle blank from the received second radiation.

12. The method of claim 11 wherein the determining the quality characteristic comprises:
comparing the received second radiation to a reference to obtain a difference;
obtaining the quality characteristic of the unprocessed reticle blank based on the difference, the quality characteristic being a defect level.

13. The method of claim 12 wherein the determining further comprises:
determining whether the defect level is within a control limit;
in the event that the defect level of the reticle blank is within the control limit, using the unprocessed reticle blank to fabricate a reticle;
in the event that the defect level of the reticle blank is outside of the control limit, subjecting the unprocessed reticle blank to a re-work step or a scrap step.

14. The method of claim 11 wherein the determining the quality characteristic further comprises:
obtaining a radiation intensity distribution using a coordinate system provided by the reticle writing system; and
determining spatial positions of defects on the unprocessed reticle blank from the radiation intensity distribution.

* * * * *